United States Patent
Lin

(10) Patent No.: US 12,080,578 B2
(45) Date of Patent: Sep. 3, 2024

(54) FRONT OPENING UNIFIED POD

(71) Applicant: Mega Rich Technologies Inc., Taipei (TW)

(72) Inventor: Kuan-Ting Lin, Taipei (TW)

(73) Assignee: Mega Rich Technologies Inc., Taipei (TW)

( * ) Notice: Subject to any disclaimer, the term of this patent is extended or adjusted under 35 U.S.C. 154(b) by 72 days.

(21) Appl. No.: 17/967,395

(22) Filed: Oct. 17, 2022

(65) Prior Publication Data
US 2023/0326775 A1 Oct. 12, 2023

(30) Foreign Application Priority Data
Apr. 7, 2022 (TW) .................................. 111113199

(51) Int. Cl.
*H01L 21/673* (2006.01)

(52) U.S. Cl.
CPC .............................. *H01L 21/67389* (2013.01)

(58) Field of Classification Search
CPC ............. H01L 21/67389; H01L 21/673; H01L 21/67383; H01L 21/67379; H01L 21/67393
USPC .......................................... 206/710–712, 823
See application file for complete search history.

(56) References Cited

U.S. PATENT DOCUMENTS

| | | | | |
|---|---|---|---|---|
| 6,875,282 B2* | 4/2005 | Tanaka | ............... | H01L 21/67393 156/345.31 |
| 7,416,998 B2* | 8/2008 | Kisakibaru | ....... | H01L 21/67017 55/318 |
| 9,842,746 B2* | 12/2017 | Woo | ..................... | H01L 21/6732 |
| 10,010,913 B2* | 7/2018 | Kaise | ..................... | B08B 9/093 |
| 10,580,675 B2* | 3/2020 | Woo | ................... | H01L 21/67393 |
| 10,847,395 B2* | 11/2020 | Woo | ................... | H01L 21/67393 |
| 11,075,100 B2* | 7/2021 | Woo | ................... | H01L 21/67393 |
| 11,355,371 B2* | 6/2022 | Woo | ................... | H01L 21/67393 |
| 2015/0040950 A1* | 2/2015 | Kaise | ..................... | B08B 9/093 15/406 |
| 2022/0359250 A1* | 11/2022 | Woo | ..................... | H01L 21/6732 |
| 2023/0326775 A1* | 10/2023 | Lin | ................... | H01L 21/67389 206/710 |
| 2023/0411191 A1* | 12/2023 | Fuller | ............... | H01L 21/67393 |

* cited by examiner

*Primary Examiner* — Chun Hoi Cheung
(74) *Attorney, Agent, or Firm* — Blank Rome LLP

(57) ABSTRACT

A front opening unified pod includes a container body, a removable front door, and an air curtain apparatus. The container body has bottom and top walls, two side walls, a rear wall connected to the bottom, top, and side walls to define a receiving space, and an opening opposite to the rear wall. The front door closes the opening. The air curtain apparatus includes an air outflow module and an air inflow pipeline connected to the air outflow module. The air outflow module is disposed on one of the top and side walls, is adjacent to the opening, and is located within the receiving space so as to form a laminar air curtain adjacent to the opening for shielding the receiving space.

4 Claims, 6 Drawing Sheets

FRONT OPENING UNIFIED POD

CROSS-REFERENCE TO RELATED APPLICATION

This application claims priority to Taiwanese Patent Application No. 111113199, filed on Apr. 7, 2022.

FIELD

The disclosure relates to a front opening unified pod, and more particularly to a front opening unified pod with an air curtain apparatus.

BACKGROUND

Generally, a semiconductor facility is provided with an equipment front end module (EFEM) for transferring wafers to be stored into or moved from a front opening unified pod (FOUP). The equipment front end module has a load port to receive the front opening unified pod. An air curtain apparatus is disposed directly above the load port of the equipment front end module to generate a laminar air curtain blowing downwardly when a front door of the front opening unified pod is opened. The laminar air curtain prevents flow of wet gases from the equipment front end module into the front opening unified pod, thereby avoiding the yield rates of the wafers in the front opening unified pod from being adversely affected.

However, because the equipment front end module is complicated in structure, the air curtain apparatus is unable or difficult to be properly installed on the equipment front end module. In such a case, the wet gases may easily flow from the equipment front end module into the front opening unified pod.

SUMMARY

Therefore, an object of the disclosure is to provide a front opening unified pod with an air curtain apparatus.

According to the disclosure, a front opening unified pod includes a container body, a front door, and an air curtain apparatus.

The container body has a bottom wall, a top wall, two side walls that are connected between the bottom wall and the top wall and that are opposite to each other, a rear wall connected to the bottom wall, the top wall, and the side walls to define a receiving space thereamong, and an opening opposite to the rear wall.

The front door is removably connected to the container body to close the opening.

The air curtain apparatus includes at least one air outflow module and an air inflow pipeline connected to the at least one air outflow module. The at least one air outflow module is disposed on one of the top wall and the side walls, is adjacent to the opening, and is located within the receiving space so as to form a laminar air curtain adjacent to the opening for shielding the receiving space.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
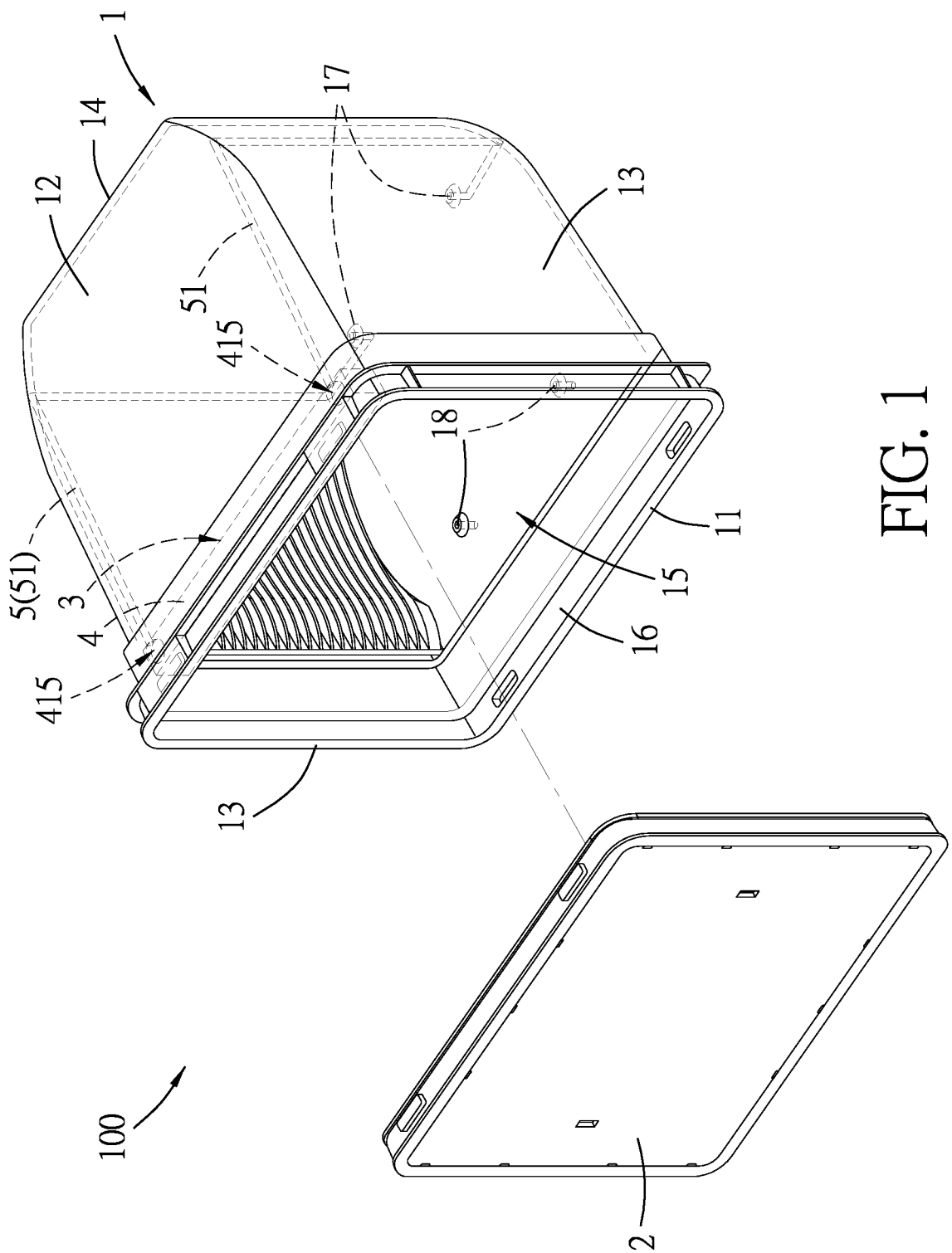
FIG. 1 is a schematic partly exploded perspective view illustrating a front opening unified pod according to a first embodiment of the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
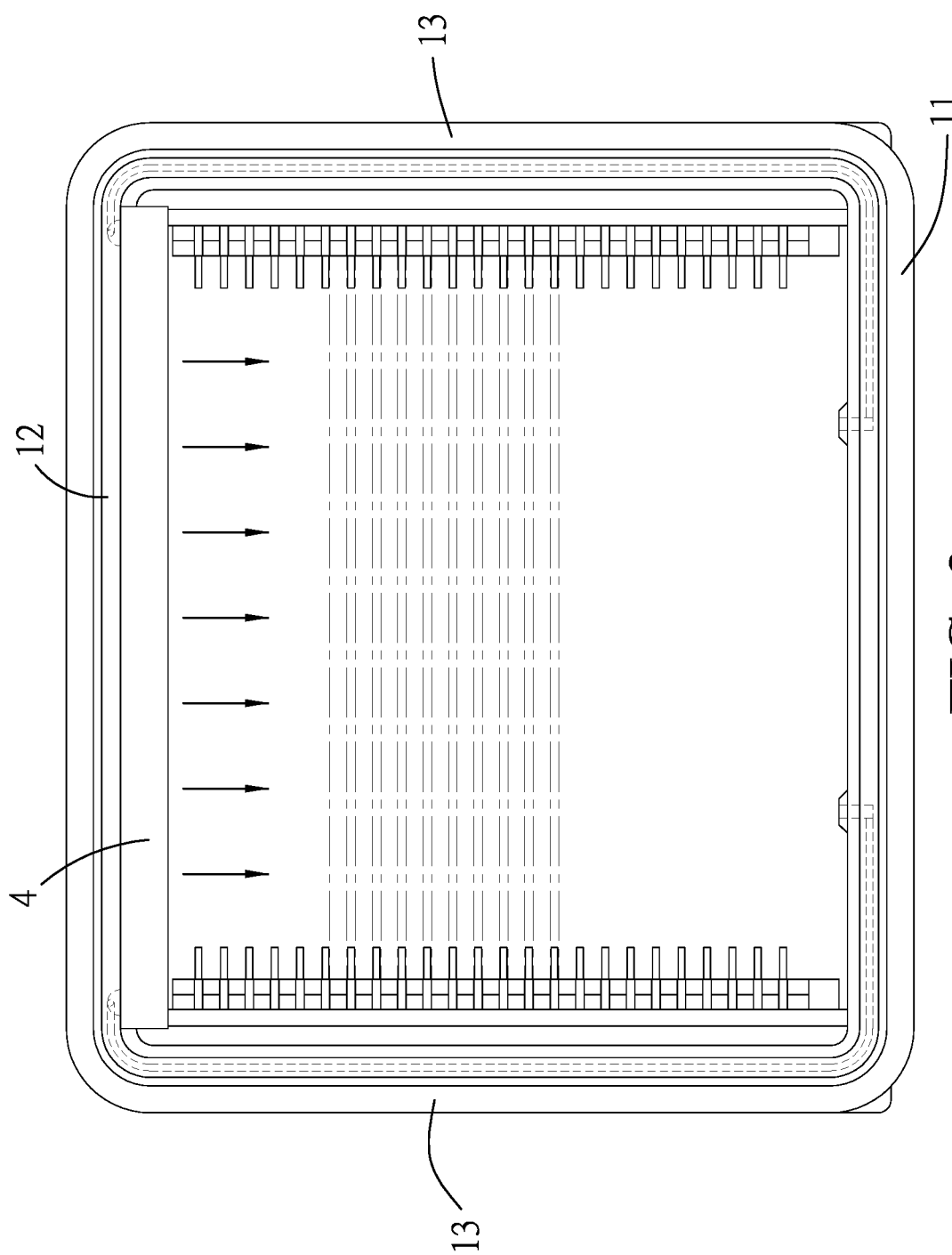
FIG. 2 is a schematic front view of the embodiment, illustrating the front opening unified pod in an open state, from which a front door is removed.
Figure 3:
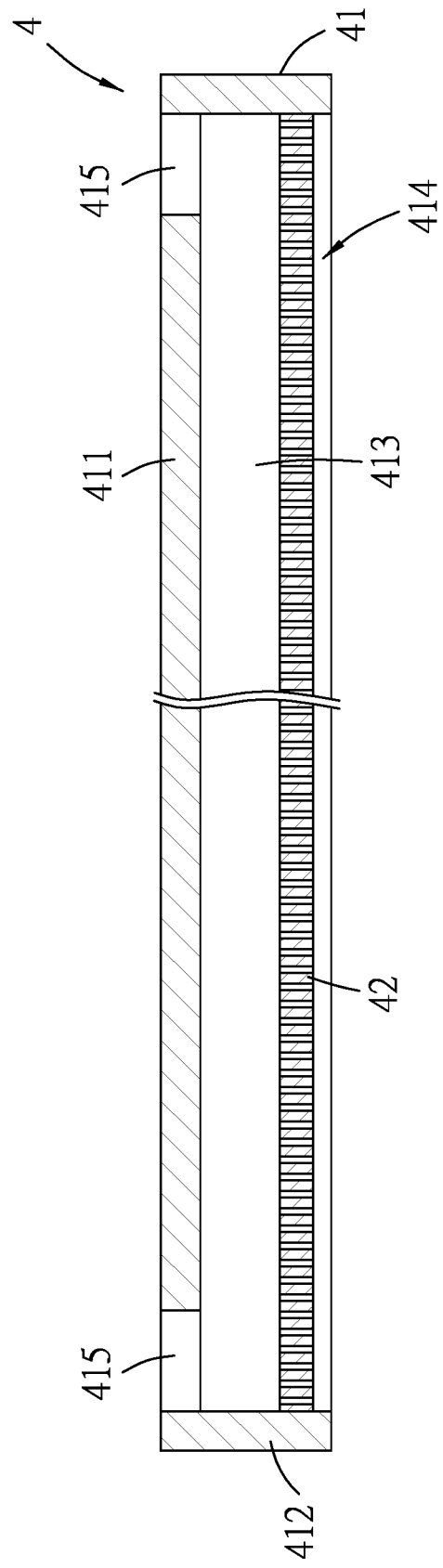
FIG. 3 is a schematic sectional view of the embodiment, illustrating an air outflow module of the front opening unified pod.

Referring to FIGS. 1 to 3, a front opening unified pod 100 according to a first embodiment of the disclosure is suitable for receiving a plurality of wafers (not shown). The front opening unified pod 100 includes a container body 1, a front door 2, and an air curtain apparatus 3.

The container body 1 has a bottom wall 11, a top wall 12, two side walls 13 that are connected between the bottom wall 11 and the top wall 12 and that are opposite to each other, a rear wall 14 connected to the bottom wall 11, the top wall 12, and the side walls 13 to define a receiving space 15 thereamong, and an opening 16 opposite to the rear wall 14. The bottom wall 11 is provided in the receiving space 15 with two inlet valves 17 adjacent to the rear wall 14 and two outlet valves 18 adjacent to the opening 16.

The front door 2 is removably connected to the container body 1 to close the opening 16.

The air curtain apparatus 3 includes an air outflow module 4 and an air inflow pipeline 5 connected to the air outflow module 4. In this embodiment, the air outflow module 4 is adjacent to the opening 16, is located within the receiving space 15, and includes a casing 41 and a porous plate 42. The casing 41 has an elongated base wall 411 and a surrounding wall 412 connected to a periphery of the elongated base wall 411. The elongated base wall 411 and the surrounding wall 412 cooperatively define a chamber 413. The casing 41 further has an air outflow opening 414 opposite to the elongated base wall 411 and two air inlet openings 415 in fluid communication with the air inflow pipeline 5. The porous plate 42 is connected to the surrounding wall 412, is disposed in the chamber 413, and is adjacent to the air outflow opening 414. In detail, the elongated base wall 411 abuts against an inner surface of the top wall 12 so that the air outflow opening 414 is oriented toward the bottom wall 11. The air inflow pipeline 5 has two conduits 51 buried in the container body 1. Each conduit 51 has two ends respectively in fluid communication with a corresponding one of the air inlet openings 415 and a corresponding one of the inlet valves 17 (see FIG. 1). When the front opening unified pod 100 is transported to a load port of an equipment front end module (not shown), dry clean gases, such as nitrogen gases or ultra clean dry air, are input into the inlet valves 17 by an air supply apparatus (not shown). After the dry clean gases enter the chamber 413 of the air outflow module 4 through the pipeline 5, the dry clean gases are discharged out of the chamber 413 in a direction toward the bottom wall 11 through the porous plate 42 so as to form a laminar air curtain adjacent to the opening 16 for shielding the receiving space 15. As such, the wet gases in the equipment front end module are prevented by the laminar air curtain from entering the receiving space 15. In principle, the flow rate of the air blown by the air outflow module 4 to generate the laminar air curtain is approximate to a gas speed in the equipment front end module, e.g., 0.3 m/s. The height and width of the casing 41 are not limited as long as access of the wafers and opening or closing of the front door 2 are not affected by the casing 41. In variant embodiments, the casing 41 may have only one air inlet opening 415, and the air inflow pipeline 5 may have only one conduit 51 in fluid communication with one of the inlet valves 17. In this embodiment, the air inlet openings 415 are formed in the elongated base wall 411. However, the air inlet openings 415 may also be formed in the surrounding wall 412.

Figure 4:
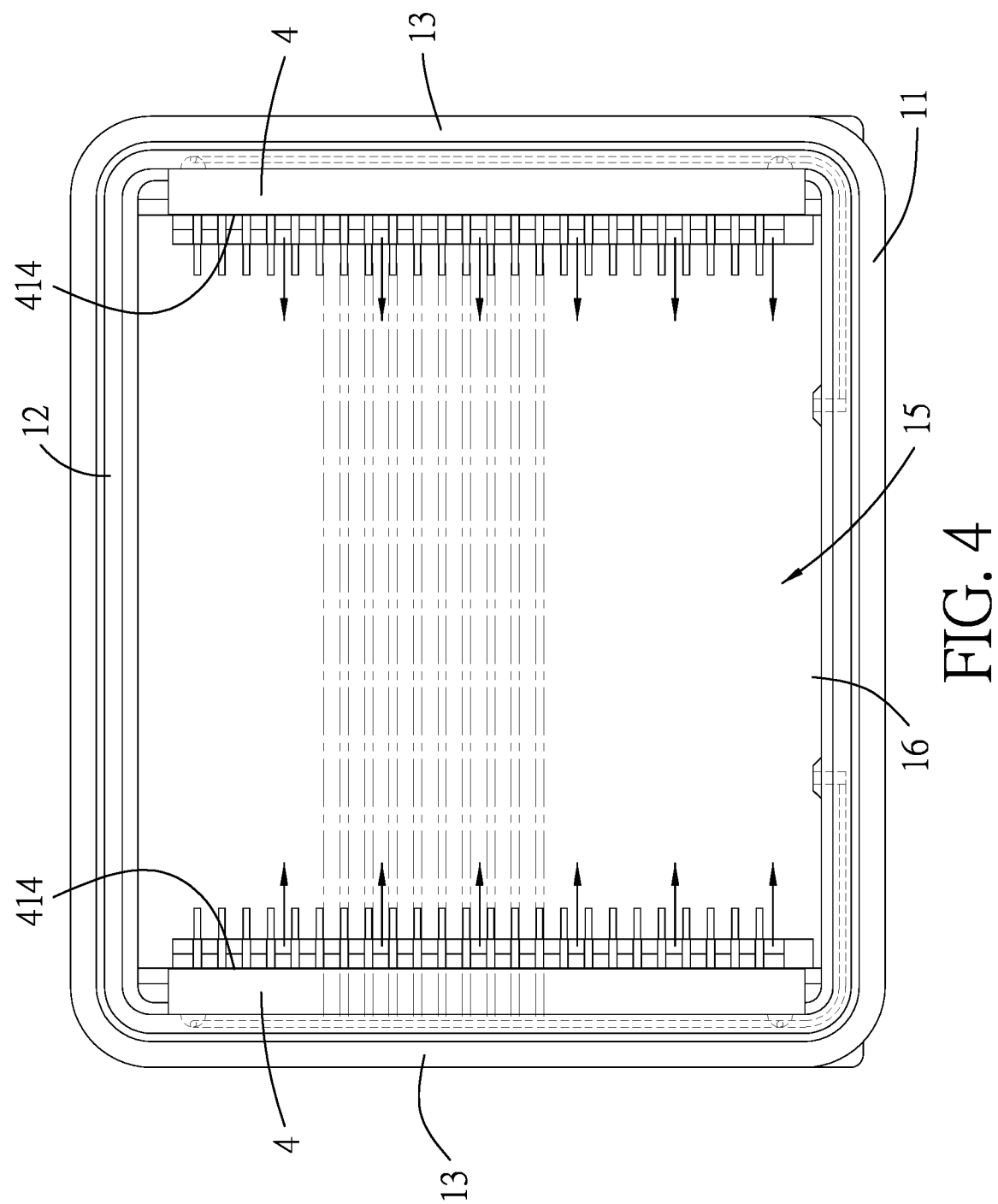
FIG. 4 is a schematic front view illustrating a front opening unified pod according to a second embodiment of the disclosure in an open state.

FIG. 4 illustrates a front opening unified pod according to a second embodiment of the disclosure, which has a configuration similar to that of the first embodiment. The difference between the first and second embodiments resides in that the air curtain apparatus 3 of the second embodiment includes two air outflow modules 4 that are respectively disposed on the side walls 13, that are adjacent to the opening 16, and that are located in the receiving space 15. In this embodiment, the air outflow openings 414 of the air outflow modules 4 face each other so as to form a laminar air curtain adjacent to the opening 16 for shielding the receiving space 15. In other embodiments, there may be only one air outflow module 4 disposed on one of the side walls 13.

Figure 5:
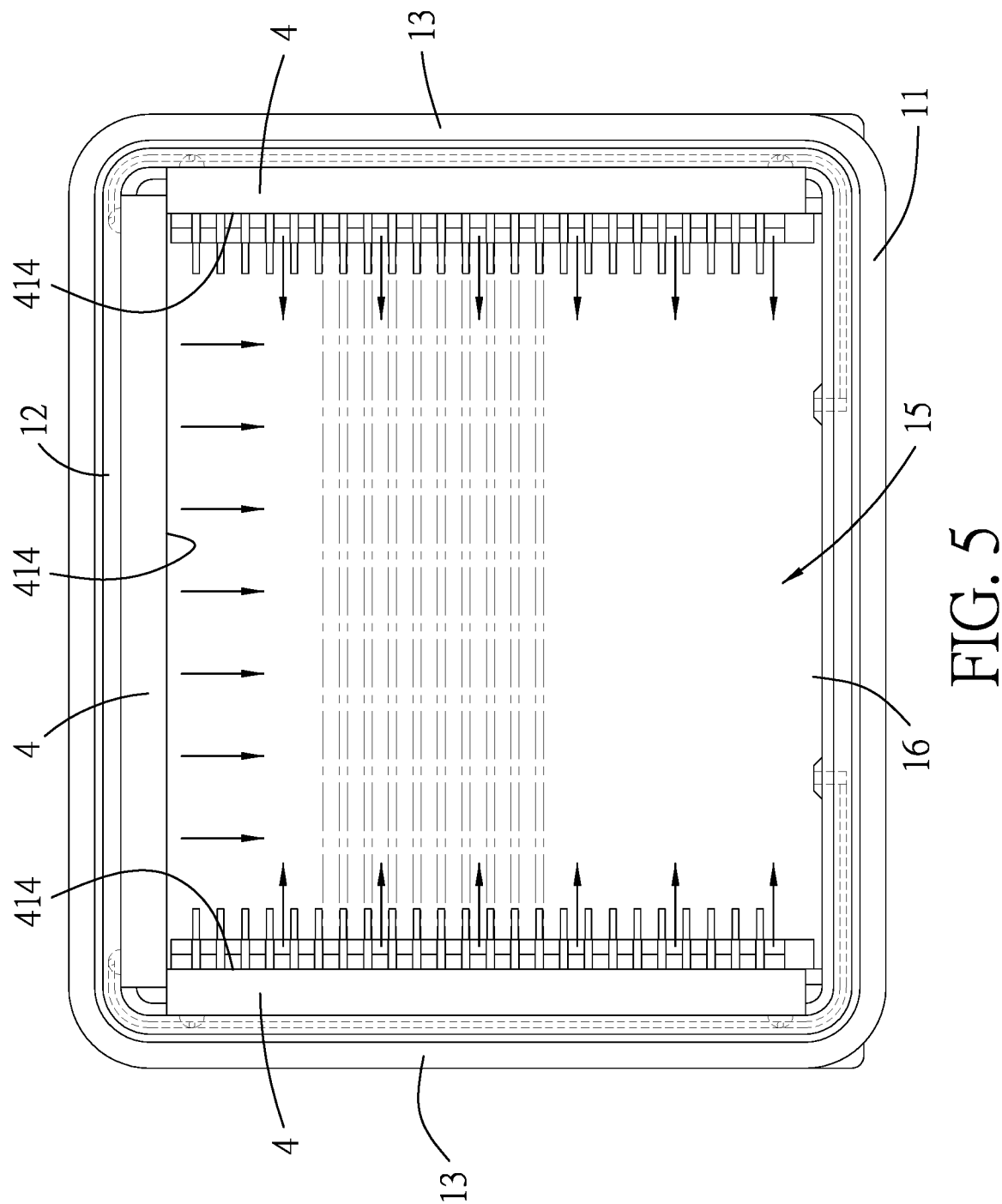
FIG. 5 is a schematic front view illustrating a front opening unified pod according to a third embodiment of the disclosure in an open state.
Figure 6:
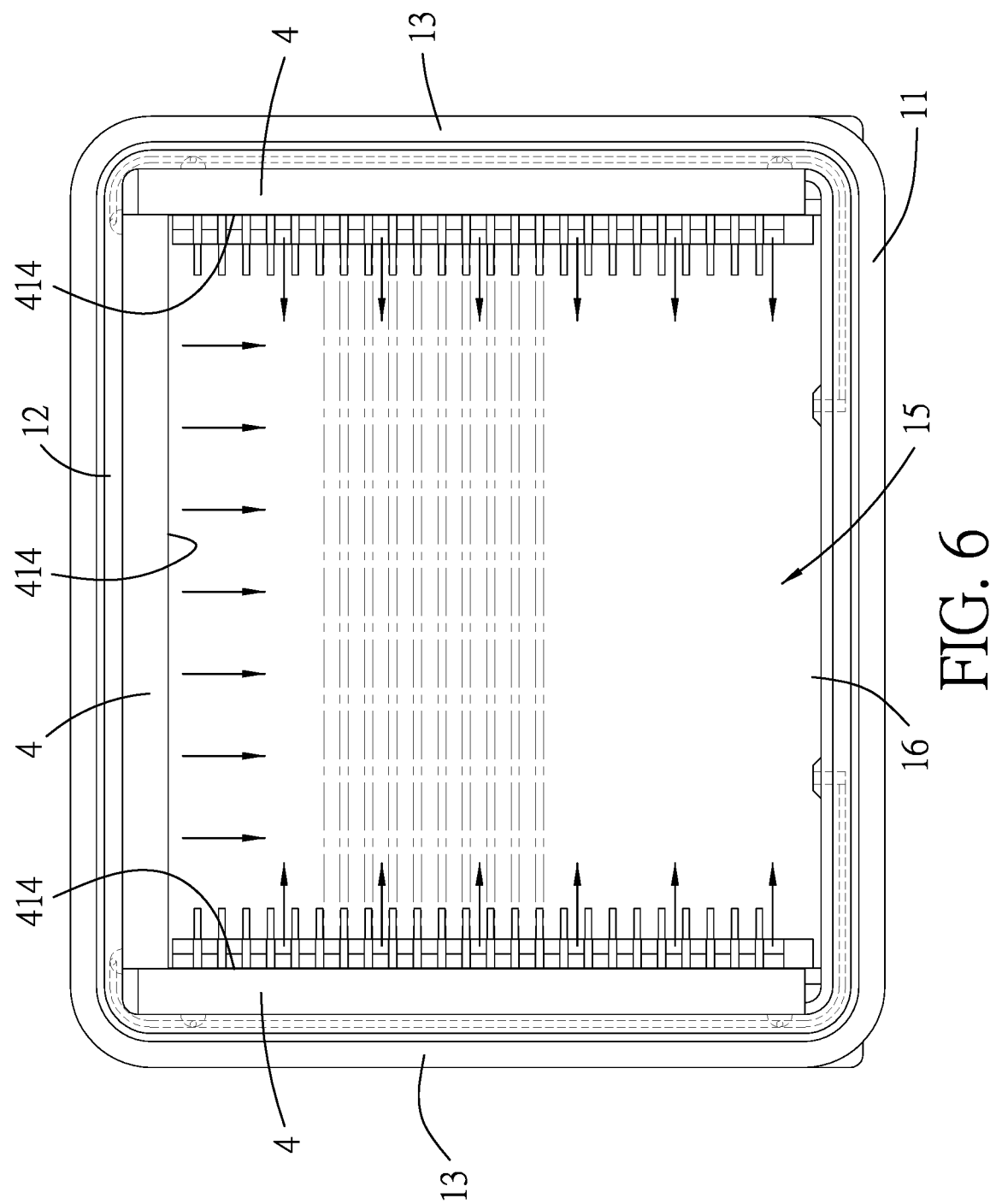
FIG. 6 illustrates a variation of the third embodiment.

Referring to FIG. 5, a front opening unified pod according to a third embodiment of the disclosure is generally similar to that of the first embodiment. The difference from the first embodiment resides in that, in the third embodiment, the air curtain apparatus 3 includes three air outflow modules 4 that are respectively disposed on the top and side walls 12, 13, that are adjacent to the opening 16, and that are located in the receiving space 15. The air outflow opening 414 of the air outflow module 4 disposed on the top wall 12 faces the bottom wall 11, and the air outflow openings 414 of the air outflow modules 4 receptively disposed on the side walls 13 face each other so as to form a laminar air curtain adjacent to the opening 16 for shielding the receiving space 15. As shown in FIG. 5, the air outflow modules 4 receptively on the side walls 13 are situated below the air outflow module 4 on the top wall 12. FIG. 6 illustrates a variant embodiment in which the air outflow module 4 on the top wall 12 is situated between the air outflow modules 4 disposed receptively on the side walls 13.

By virtue of the air curtain apparatus 3 to form the laminar air curtain adjacent to the opening 16 for shielding the receiving space 15, the wet gases are prevented from entering the receiving space 15, thereby reducing the risk affecting adversely the yield rates of wafers stored in the front opening unified pod 100.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A front opening unified pod, comprising:
   a container body having a bottom wall, a top wall, two side walls that are connected between said bottom wall and said top wall and that are opposite to each other, a rear wall connected to said bottom wall, said top wall, and said side walls to define a receiving space thereamong, and an opening opposite to said rear wall;
   a front door removably connected to said container body to close said opening; and
   an air curtain apparatus including at least one air outflow module and an air inflow pipeline connected to said at least one air outflow module, said at least one air outflow module being disposed on one of said top wall and said side walls, being adjacent to said opening, and being located within said receiving space so as to form a laminar air curtain adjacent to said opening for shielding said receiving space;
   wherein said at least one air outflow module has a casing and a porous plate, said casing having an elongated base wall and a surrounding wall connected to a periphery of said elongated base wall, said elongated base wall and said surrounding wall cooperatively defining a chamber, said casing further having an air outflow opening opposite to said elongated base wall, and at least one air inlet opening in fluid communication with said air inflow pipeline, said porous plate being connected to said surrounding wall, being disposed in said chamber, and being adjacent to said air outflow opening.

2. The front opening unified pod as claimed in claim 1, wherein said at least one air outflow module is one in number and is disposed on one of said top wall and said side walls.

3. The front opening unified pod as claimed in claim 1, wherein said at least one air outflow module includes two said air outflow modules respectively disposed on said side walls.

4. The front opening unified pod as claimed in claim 1, wherein said at least one air outflow module includes three said air outflow modules respectively disposed on said top wall and said side walls.

* * * * *